US008067967B2

(12) United States Patent
Zhang et al.

(10) Patent No.: US 8,067,967 B2
(45) Date of Patent: Nov. 29, 2011

(54) PHASE DELAY LINE

(75) Inventors: Ziche Zhang, Chengdu (CN); Guosheng Wu, Chengdu (CN)

(73) Assignee: IPGoal Microelectronics (SiChuan) Co., Ltd., High-Tech Incubation Park, Chengdu, Sichuan Province (CN)

( * ) Notice: Subject to any disclaimer, the term of this patent is extended or adjusted under 35 U.S.C. 154(b) by 172 days.

(21) Appl. No.: 12/501,386

(22) Filed: Jul. 10, 2009

(65) Prior Publication Data

US 2010/0123497 A1    May 20, 2010

(30) Foreign Application Priority Data

Nov. 20, 2008  (CN) .......................... 2008 1 0147608

(51) Int. Cl.
H03L 7/06    (2006.01)

(52) U.S. Cl. ...................................... 327/158

(58) Field of Classification Search .................. 327/149, 327/158, 131–140
See application file for complete search history.

(56) References Cited

U.S. PATENT DOCUMENTS

| 4,581,585 | A  | * | 4/1986  | Bristol ........................... 327/134 |
| 5,907,253 | A  | * | 5/1999  | Davis et al. .................... 327/156 |
| 6,930,520 | B2 | * | 8/2005  | Solie .............................. 327/131 |
| 7,315,585 | B2 | * | 1/2008  | Gater ............................. 375/316 |
| 7,511,541 | B2 | * | 3/2009  | Chatal et al. .................. 327/111 |
| 7,642,820 | B2 | * | 1/2010  | Chen et al. ..................... 327/131 |
| 7,746,129 | B2 | * | 6/2010  | Choi et al. ..................... 327/131 |
| 2007/0229126 | A1 | * | 10/2007 | Nam ............................. 327/131 |
| 2010/0231272 | A1 | * | 9/2010  | Chen et al. ..................... 327/140 |

* cited by examiner

Primary Examiner — Lincoln Donovan
Assistant Examiner — Adam Houston

(57) ABSTRACT

A phase delay line comprises a phase-locked loop, a duty-cycle adjusting ring and a voltage-sharing to time-sharing converter, wherein the phase-locked loop and the duty-cycle adjusting ring form a loop, and one output of the phase-locked loop is connected with the input of the voltage-sharing to time-sharing converter. The voltage can be precisely divided, and the number of the phases can be easily controlled and expanded. The band gap reference technology enables the working points not affected by the temperature. The negative feedback mechanism of the phase-locked loop determines the period, phase, duty-cycle of the sawtooth wave are same with the reference clock. The ascending and descending time of the sawtooth wave are precisely equal.

20 Claims, 3 Drawing Sheets

PHASE DELAY LINE

BACKGROUND OF THE PRESENT INVENTION

1. Field of Invention

The present invention relates to integrated circuit, and more particularly to a kind of phase delay line.

2. Description of Related Arts

The multi-phase clock signals with the same frequency produced by the phase delay line are widely used for data acquisition. The conventional delay line mainly includes a plurality of RC delay units connected in series. The process ununiformity causes the mismatch between R and C, which results in the different delays of different phase delay units. Therefore, it is impossible to increase or decrease the phase numbers by inserting or taking off delay unit.

SUMMARY OF THE PRESENT INVENTION

An object of the present invention is to provide a phase delay line, which can precisely divide the reference clock into n-phases clocks of same phase interval.

Accordingly, in order to accomplish the above object, the present invention provides a phase delay line including a phase-locked loop, a duty-cycle adjusting ring and a voltage-sharing to time-sharing converter, wherein the phase-locked loop and the duty-cycle adjusting ring form a loop, and one output of the phase-locked loop is connected with the input of the voltage-sharing to time-sharing converter.

The signal flow of the phase delay line is illustrated as follows. The reference square wave clock at about 50% duty cycle is inputted into the phase-locked loop. One output of the phase-locked loop is a sawtooth wave having same frequency with the reference clock, and the phase-locked loop inputs the sawtooth wave into the voltage-sharing to time-sharing converter. The voltage-sharing to time-sharing converter outputs n-phase square wave clocks having same frequency with the reference clock and equally divided phase, wherein n≧2. The phase-locked loop and the voltage-sharing to time-sharing converter are the main signal channel. Another output of the phase-locked loop is a square wave having same frequency with the reference clock, and the phase-locked loop inputs the square wave into the duty-cycle adjusting ring. The duty-cycle adjusting ring outputs a duty-cycle fine adjustment current back to the phase-locked loop so as to adjust the discharge current of capacitance in the phase-locked loop.

The phase-locked loop includes a phase detector, a charge pump, a voltage to current converter, a charge and discharge network of capacitance, and an up and down threshold decision circuit of sawtooth wave.

In the phase-locked loop, a reference clock and a feedback clock, as two input signals, are inputted into the phase detector. The output of the phase detector is inputted into the charge pump, and then to the voltage to current converter. The output current of the voltage to current converter is inputted into the charge and discharge network of capacitance as the charge and discharge current. The output of the charge and discharge network of capacitance is inputted into the up and down threshold decision circuit of sawtooth wave. The up and down threshold decision circuit of sawtooth wave outputs a switch control signal to control the charge and discharge network of capacitance, and outputs the feedback clock to the phase detector.

The duty-cycle adjusting ring includes a duty-cycle adjusting circuit and a duty-cycle fine adjustment current source.

In the duty-cycle adjusting ring, the up and down threshold decision circuit of sawtooth wave of the phase-locked loop outputs the feedback clock to the duty-cycle adjusting circuit, and then to the duty-cycle fine adjustment current source. The duty-cycle fine adjustment current source outputs a fine adjustment discharge current into the charge and discharge network of capacitance of the phase-locked loop.

The voltage-sharing to time-sharing converter includes a voltage dividing network, a plurality of comparators and a plurality of triggers.

In the voltage-sharing to time-sharing converter, the voltage dividing network comprises two or more resistors of same value connected in series between a high reference voltage and a low reference voltage, and two or more switches connected with the resistors in parallel respectively to control the connection of the resistors to the voltage dividing network. The voltage dividing network outputs the equally divided voltage to the negative terminal of each comparator, and the phase-locked loop outputs the sawtooth wave to the positive terminal of each comparator. Then each comparator output the comparison result of the sawtooth wave and the equally divided voltage to the corresponding trigger. The up and down threshold decision circuit of sawtooth wave of the phase-locked loop outputs a square wave 1 and square wave 2 to input ends of the upper middle and lower middle triggers respectively. In each DFF (D trigger) of the triggers, D and Q are connected to form a frequency divider. The n triggers output n-phase clocks with same phase interval having a period 2 times of the reference clock.

The phase delay line utilizes the phase-locked mechanism to make the charge and discharge network of capacitance to produce sawtooth wave that has the same duty-cycle and same period with the reference clock, and produces n-phase square wave clocks through the voltage-sharing to time-sharing converter wherein n≧2.

The working flow of the phase delay line is illustrated hereinafter.

A. The phase-locked loop locks the feedback clock to the reference clock via phase-locked mechanism.

If the feedback clock of initial state and the reference clock have a phase difference ΔΦ, the phase detector detects ΔΦ, and the charge pump covert ΔΦ to a corresponding voltage, and then the voltage to current converter converts the voltage to a charge and discharge current I0 through the charge and discharge network of capacitance. I0 is directly proportional to the frequency of the sawtooth wave produced by the charge and discharge network of capacitance. The up and down threshold decision circuit of sawtooth wave converts the sawtooth wave to a square wave having the same frequency with the sawtooth wave. The square wave is the feedback clock. The negative feedback mechanism makes I0 to keep reducing ΔΦ.

B. While the phase-locked loop locks the phase, the duty-cycle adjusting circuit adjusts the duty-cycle of the feedback clock equal to the duty-cycle of the reference clock, which is about 50%. That is to say, the ascending and descending time of the sawtooth wave are equal.

The charge current is slightly larger than the discharge current in the charge and discharge network of capacitance of the phase-locked loop. The slight difference between the charge current and the discharge current is adjusted by the fine adjustment discharge current produced by the duty-cycle adjusting circuit so as to produce a constant duty-cycle of 50%.

C. A sawtooth wave obtained through step A and B has the same frequency with the reference square wave and has equal ascending and descending time. By the conversion from the voltage equal division to the time equal division, the vertical ordinate (voltage) of the sawtooth wave are equally divided in the ascending and descending edge, so that the horizontal ordinate (time) of the sawtooth wave are also equally divided.

The voltage dividing network equally divides the amplitude of the sawtooth wave. The equal division reference point is inputted into the negative terminal of the corresponding comparator, and the sawtooth wave is inputted into the positive terminal of the corresponding comparator. At an ascending edge of the sawtooth wave, the comparators output digital ascending edge, which actuates the frequency divider composed by trigger DEFs, so that the voltage equal division is converted to the time equal division (phase).

The working process of the phase delay line is illustrated as below.

Reference clock of 50% duty-cycle→sawtooth wave having same frequency, phase and duty-cycle→equally divided amplitude of the sawtooth wave→equally divided time of the sawtooth wave (phase)

The beneficial result of the present invention is as follows.
1. The most advantage of the present invention over the conventional technique is that the voltage of the sawtooth wave can be precisely divided. The equal division points are obtained from the voltage division network. Though the resistor of CMOS process has 20% error, the ratio of the resistors can be precise, so that the voltage can be equally divided. Though the circuit of the present invention, the equal division of the vertical ordinate (voltage) is converted into the equal division of the horizontal ordinate (time), because the equal division of the voltage is much easier than the equal division of the time.
2. Another advantage of the present invention is that the reference clock is equally divided to n+1-phase clocks with same interval, only by setting the number of the resistors of the voltage division network as n, and the phase number can be easily controlled and expanded.
3. All the reference voltage and current adopt band gap reference technology, so that the working points will not be affected by the temperature.
4. The negative feedback mechanism of the phase-locked loop determines the period, phase, duty-cycle of the sawtooth wave are same with the reference clock, and will not be affected by the process and temperature.
5. Because the duty-cycle adjusting circuit makes the duty-cycle of the sawtooth wave equal to that of the reference clock, which is 50%, so that the ascending and descending time of the sawtooth wave are precisely equal.
6. Equal division of the voltage (high reference voltage-low reference voltage) can obtain precise delay, which is irrelevant to the absolute value of the high reference voltage and the low reference voltage.

DETAILED DESCRIPTION OF THE PREFERRED EMBODIMENT

Figure 1:
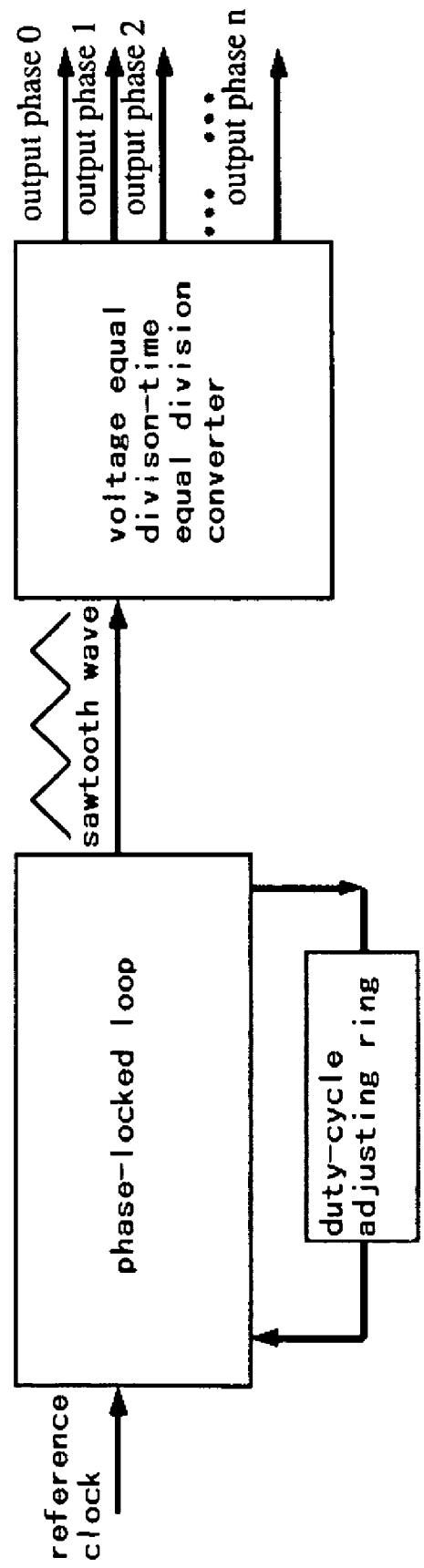
FIG. 1 is a schematic view of the phase delay line according to a preferred embodiment of the present invention, illustrating the principle of the phase delay line.
Figure 2:
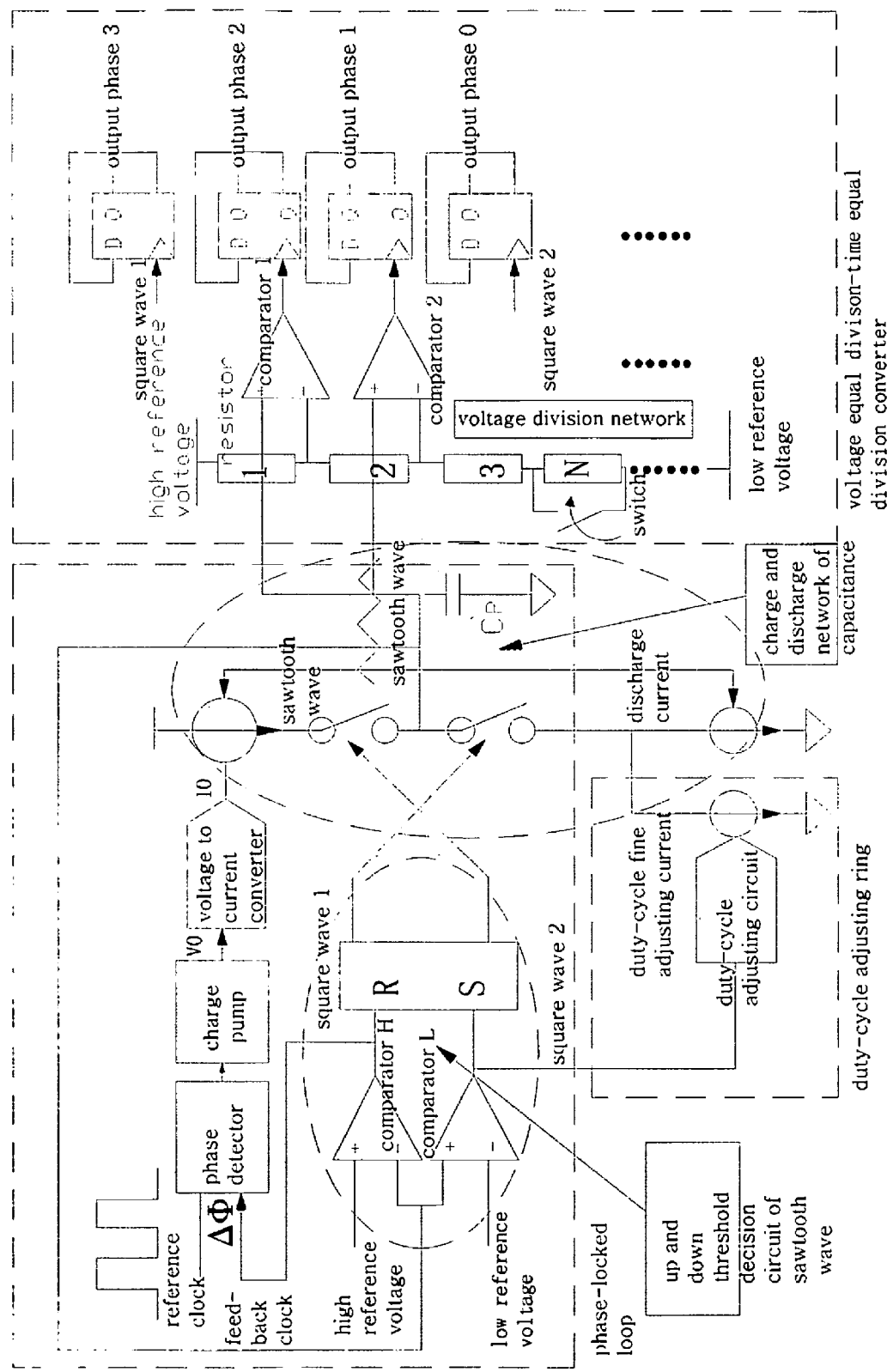
FIG. 2 is a schematic view of a phase delay line according to a preferred embodiment of the present invention, illustrating the detailed circuit of the phase delay line.

Referring to FIGS. 1 and 2 of the drawings, a phase delay line according to a preferred embodiment of the present invention is illustrated, in which the phase delay line comprises a phase-locked loop, a duty-cycle adjusting ring and a voltage-sharing to time-sharing converter, wherein the phase-locked loop and the duty-cycle adjusting ring form a loop, and one output of the phase-locked loop is connected with the input of the voltage equal division to time equal division converter.

The signal flow of the phase delay line is illustrated as follows. The reference square wave clock at about 50% duty cycle enters into the phase-locked loop. One output of the phase-locked loop is a sawtooth wave having same frequency with the reference clock, and the phase-locked loop inputs the sawtooth wave into the voltage-sharing to time-sharing converter. The voltage-sharing to time-sharing converter outputs a n-phase square wave clocks having same frequency with the reference clock and equally divided phase, wherein $n \geq 2$. The phase-locked loop and the voltage-sharing to time-sharing converter are the main signal channel. Another output of the phase-locked loop is a square wave having same frequency with the reference clock, and the phase-locked loop inputs the square wave into the duty-cycle adjusting ring. The duty-cycle adjusting ring outputs a duty-cycle fine adjustment current back to the phase-locked loop so as to adjust the discharge current of capacitance in the phase-locked loop.

The phase-locked loop includes a phase detector, a charge pump, a voltage to current converter, a charge and discharge network of capacitance, and an up and down threshold decision circuit of sawtooth wave.

In the phase-locked loop, a reference clock and a feedback clock, as two input signals, are inputted into the phase detector. The output of the phase detector is inputted into the charge pump, and then to the voltage to current converter. The output current of the voltage to current converter is inputted into the charge and discharge network of capacitance as the charge and discharge current. The output of the charge and discharge network of capacitance is inputted into the up and down threshold decision circuit of sawtooth wave. The up and down threshold decision circuit of sawtooth wave outputs a switch control signal to control the charge and discharge network of capacitance, and outputs the feedback clock to the phase detector.

The duty-cycle adjusting ring includes a duty-cycle adjusting circuit and a duty-cycle fine adjustment current source.

In the duty-cycle adjusting ring, the up and down threshold decision circuit of sawtooth wave of the phase-locked loop outputs the feedback clock to the duty-cycle adjusting circuit, and then to the duty-cycle fine adjustment current source. The duty-cycle fine adjustment current source outputs a fine adjustment discharge current into the charge and discharge network of capacitance of the phase-locked loop.

The voltage-sharing to time-sharing converter includes a voltage dividing network, a plurality of comparators and a plurality of triggers.

In the voltage-sharing to time-sharing converter, the voltage dividing network comprises two or more resistors of same value connected in series between a high reference voltage and a low reference voltage, and two or more switches connected with the resistors in parallel respectively to control the connection of the resistors to the voltage dividing network. The voltage dividing network outputs the equally divided voltage to the negative terminal of each comparator, and the phase-locked loop outputs the sawtooth wave to the positive terminal of each comparator. Then each comparator output the comparison result of the sawtooth wave and the equally divided voltage to the corresponding trigger. The up and down threshold decision circuit of sawtooth wave of the phase-locked loop outputs a square wave 1 and square wave 2 to input ends of the upper middle and lower middle triggers respectively. In each DFF (D trigger) of the triggers, D and Q are connected to form a frequency divider. The n triggers output n-phase clocks with same phase interval having a period 2 times of the reference clock.

The phase delay line utilizes the phase-locked technology to make the charge and discharge network of capacitance to produce sawtooth wave that has the same duty-cycle and same period with the reference clock, and produces n-phase square wave clocks through the voltage-sharing to time-sharing converter, wherein n≧2.

The working flow of the phase delay line is illustrated hereinafter.

A. The phase-locked loop locks the feedback clock to the reference clock via phase-locked mechanism.

If the feedback clock of initial state and the reference clock have a phase difference $\Delta\Phi$, the phase detector detects $\Delta\Phi$, and the charge pump covert $\Delta\Phi$ to a corresponding voltage, and then the voltage to current converter converts the voltage to a charge and discharge current I0 through the charge and discharge network of capacitance. I0 is directly proportional to the frequency of the sawtooth wave produced by the charge and discharge network of capacitance. The up and down threshold decision circuit of sawtooth wave converts the sawtooth wave to a square wave having the same frequency with the sawtooth wave. The square wave is the feedback clock. The negative feedback mechanism keeps reducing $\Delta\Phi$ of the I0.

B. While the phase-locked loop locks the phase, the duty-cycle adjusting circuit adjusts the duty-cycle of the feedback clock equal to the duty-cycle of the reference clock, which is about 50%. That is to say, the ascending and descending time of the sawtooth wave are equal.

The charge current is slightly larger than the discharge current in the charge and discharge network of capacitance of the phase-locked loop. The slight difference between the charge current and the discharge current is adjusted by the fine adjustment discharge current produced by the duty-cycle adjusting circuit so as to produce a constant duty-cycle of 50%.

C. A sawtooth wave obtained through step A and B has the same frequency with the reference square wave and has equal ascending and descending time. By the conversion from the voltage equal division to the time equal division, the vertical ordinate (voltage) of the sawtooth wave are equally divided in the ascending and descending edge, so that the horizontal ordinate (time) of the sawtooth wave are also equally divided.

The voltage dividing network equally divides the amplitude of the sawtooth wave. The equal division reference point is inputted into the negative terminal of the corresponding comparator, and the sawtooth wave is inputted into the positive terminal of the corresponding comparator. At an ascending edge of the sawtooth wave, the comparators output digital ascending edge, which actuates the frequency divider composed by trigger DEFs, so that the voltage equal division is converted to the time equal division (phase).

The working process of the phase delay line is illustrated as below.

Reference clock of 50% duty-cycle→sawtooth wave having same frequency, phase and duty-cycle→equally divided amplitude of the sawtooth wave→equally divided time of the sawtooth wave (phase)

Figure 3:
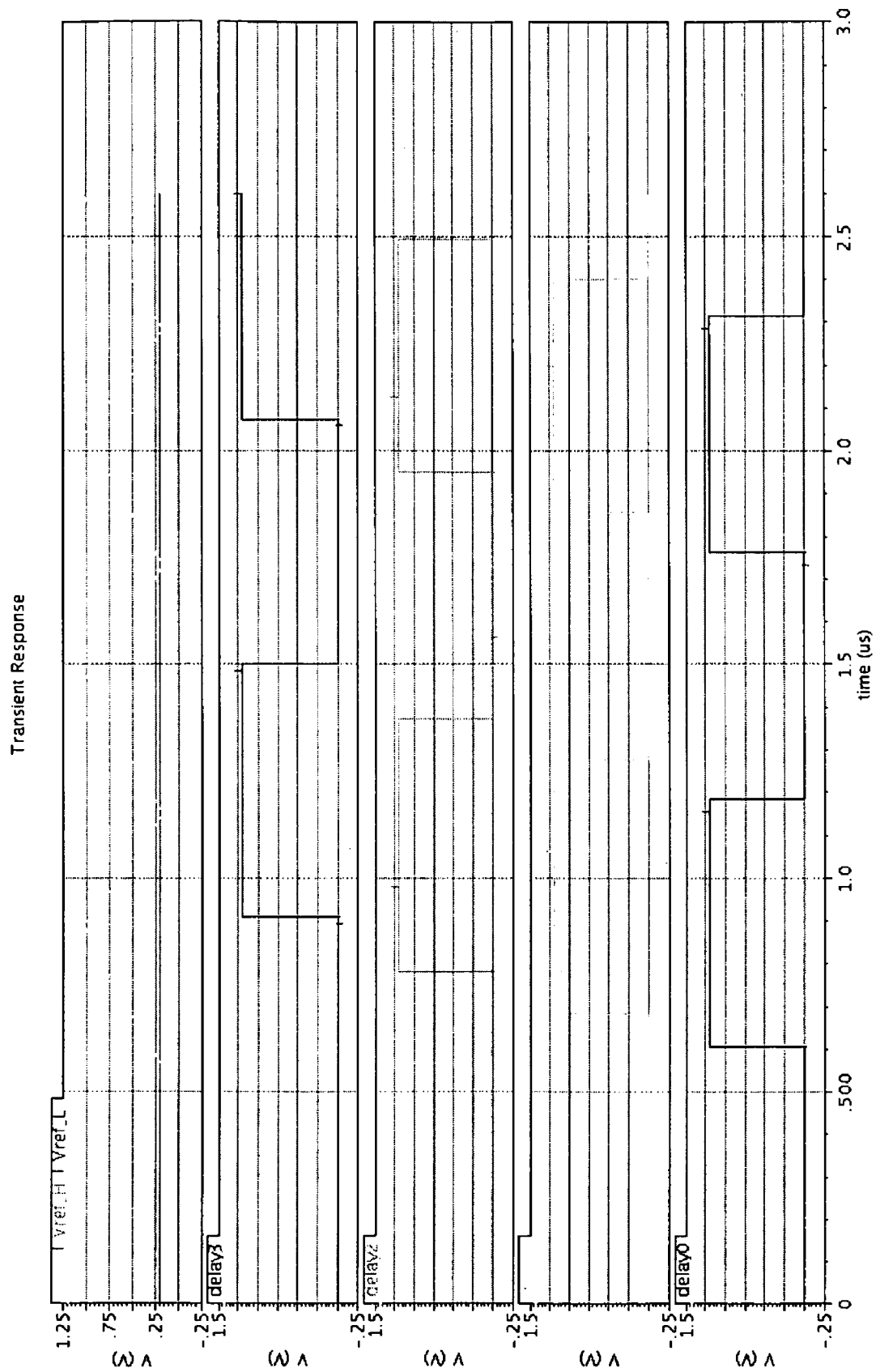
FIG. 3 is a simulation result of a phase delay line according to the above preferred embodiment of the present invention.

FIG. 3 shows the simulation result of n=3.

What is claimed is:

1. A phase delay line, comprising:
    a phase-locked loop comprising a phase detector, a charge pump, a voltage-to-current converter, a charge and discharge network of capacitance, and an up and down threshold decision circuit of sawtooth wave, wherein a reference clock and a feedback clock, as two input signals, are inputted into said phase detector, an output end of said phase detector is connected with an input end of said charge pump, an output end of said charge pump is connected with an input end of said voltage-to-current converter, said voltage-to-current converter outputs an output current as a charging and discharging current of said charge and discharge network of capacitance, said charge and discharge network of capacitance outputs a sawtooth wave having a same frequency with said reference clock into said up and down threshold decision circuit of sawtooth wave, said up and down threshold decision circuit of sawtooth wave outputs a switch control signal for controlling said charge and discharge network of capacitance, and simultaneously, said up and down threshold decision circuit of sawtooth wave outputs a first square wave, namely, said feedback clock to an input end of said phase detector, so that a phase-locked feedback loop is achieved;
    a duty-cycle adjusting ring comprising a duty-cycle adjusting circuit and a duty-cycle fine adjustment current source, wherein said up and down threshold decision circuit of sawtooth wave outputs a second square wave to an input end of said duty-cycle adjusting circuit, an output end of said duty-cycle adjusting circuit is connected with an input end of said duty-cycle fine adjustment current source, said duty-cycle fine adjustment current source outputs a fine adjustment discharge current to said input end of said charge and discharge network of capacitance for adjusting a discharging current of said charge and discharge network of capacitance, so that a duty-cycle adjustment feedback loop is achieved; and
    a voltage-sharing to time-sharing converter comprising a voltage dividing network, a set of comparators and a set of edge-triggered flip-flops, wherein said voltage dividing network comprises at least two resistors having a same resistance and connected with each other in series between a first reference voltage and a second reference voltage, and at least two switches respectively connected with said resistors in parallel, wherein said voltage dividing network outputs an equally divided voltage to a negative end of each of said comparators, said sawtooth wave outputted by said phase-locked loop is inputted into a positive end of each of said comparators, an output end of each of said comparators is connected with a clock input end of a corresponding flip-flop, said up and down threshold decision circuit of sawtooth wave respectively outputs said first square wave and said second square wave to a clock input end of an upper flip-flop and a clock input end of a lower flip-flop, wherein each of said edge-triggered flip-flops forms a frequency divider, said set of edge-triggered flip-flops composed of n flip-flops outputs equally divided n phase clocks each having a period 2 times of said reference clock.

2. The phase delay line, as recited in claim 1, wherein each of said set of edge-triggered flip-flops is a D flip-flop, wherein D terminal is connected with ~Q terminal in said D flip-flop.

3. The phase delay line, as recited in claim 1, wherein said reference clock and said feedback clock have a same duty ratio.

4. The phase delay line, as recited in claim 2, wherein said reference clock and said feedback clock have a same duty ratio.

5. The phase delay line, as recited in claim 1, wherein said reference clock has a duty ratio of 50%.

6. The phase delay line, as recited in claim 2, wherein said reference clock has a duty ratio of 50%.

7. The phase delay line, as recited in claim 3, wherein said reference clock has a duty ratio of 50%.

8. The phase delay line, as recited in claim 4, wherein said reference clock has a duty ratio of 50%.

9. The phase delay line, as recited in claim 1, wherein said reference clock is a square wave.

10. The phase delay line, as recited in claim 2, wherein said reference clock is a square wave.

11. The phase delay line, as recited in claim 4, wherein said reference clock is a square wave.

12. The phase delay line, as recited in claim 8, wherein said reference clock is a square wave.

13. The phase delay line, as recited in claim 1, wherein a charging current of said charge and discharge network of capacitance is larger than a discharging current thereof.

14. The phase delay line, as recited in claim 2, wherein a charging current of said charge and discharge network of capacitance is larger than a discharging current thereof.

15. The phase delay line, as recited in claim 3, wherein a charging current of said charge and discharge network of capacitance is larger than a discharging current thereof.

16. The phase delay line, as recited in claim 4, wherein a charging current of said charge and discharge network of capacitance is larger than a discharging current thereof.

17. The phase delay line, as recited in claim 7, wherein a charging current of said charge and discharge network of capacitance is larger than a discharging current thereof.

18. The phase delay line, as recited in claim 8, wherein a charging current of said charge and discharge network of capacitance is larger than a discharging current thereof.

19. The phase delay line, as recited in claim 11, wherein a charging current of said charge and discharge network of capacitance is larger than a discharging current thereof.

20. The phase delay line, as recited in claim 12, wherein a charging current of said charge and discharge network of capacitance is larger than a discharging current thereof.

* * * * *